United States Patent [19]
Kwak

[11] Patent Number: 6,020,597
[45] Date of Patent: Feb. 1, 2000

[54] REPAIRABLE MULTICHIP MODULE

[75] Inventor: Duk Joo Kwak, Seoul, Rep. of Korea

[73] Assignee: LG Semicon Co., Ltd., Choongcheongbuk-Do

[21] Appl. No.: 09/034,699

[22] Filed: Mar. 4, 1998

[30] Foreign Application Priority Data

Mar. 5, 1997 [KR] Rep. of Korea ......................... 97-7164

[51] Int. Cl.[7] .................................................. H01L 23/58
[52] U.S. Cl. .............................. 257/48; 257/726; 257/727
[58] Field of Search .................................... 257/726, 727, 257/48; 438/15, 117, 107

[56] References Cited

U.S. PATENT DOCUMENTS

| | | | |
|---|---|---|---|
| 3,506,889 | 4/1970 | Vogt | 257/726 |
| 4,922,376 | 5/1990 | Pommer et al. | 257/718 |
| 5,250,843 | 10/1993 | Eichelberger . | |
| 5,345,107 | 9/1994 | Daikoku et al. | 257/717 |
| 5,682,064 | 10/1997 | Atkins et al. | 257/726 |
| 5,751,062 | 5/1998 | Daikoku et al. | 257/724 |
| 5,866,944 | 2/1999 | Hiyoshi et al. | 257/727 |

FOREIGN PATENT DOCUMENTS 56-142660  11/1981  Japan ..................... 257/726

*Primary Examiner*—David B. Hardy

[57] ABSTRACT

A semiconductor multichip module includes a plurality of semiconductor chips, a static plate having a plurality of insertion holes for receiving the plurality of chips, a shield cap attached onto the lower surface of the static plate for preventing the chips from deviating downward through the insertion holes, an external terminal unit formed over the chips for externally transmitting electrical signals of the chips, and a plurality of clip-type clamp springs clamping the shield cap and the external terminal unit for preventing the chips from externally deviating. The multichip module improves productivity by decreasing production hours and enables effective chips to be easily replaced with normal chips by disassembling and reassembling the clamp springs.

21 Claims, 7 Drawing Sheets

REPAIRABLE MULTICHIP MODULE

BACKGROUND OF THE INVENTION

1. Field of the Invention

The present invention relates to a semiconductor multichip module, and more particularly to an improved semiconductor multichip module that can be fabricated by simplified assembly steps and that can enhance productivity.

2. Description of the Prior Art

U.S. Pat. No. 5,250,843 discloses a general repairable multichip module. To fabricate that module, an encapsulant, metallic wires, an insulation layer and the like are formed on a semiconductor chip using methods such as etching, and ultraviolet setting. The metallic wires are removed using solvent in order to replace defective chips. That is, using a chemical or physical method, the defective chips are removed and replaced by normal chips to thereby complete the multichip module. The resulting conventional multichip module will now be described.

With reference to FIG. 1 showing a cross-sectional view of a repairable multichip module according to the conventional art, the multichip module includes: a semiconductor substrate 1; an adhesive 2 coated on the substrate 1; a plurality of semiconductor chips 3 attached on the adhesive 2 and spaced from each other by a certain distance; an encapsulant 4 patterned to expose a plurality of pads (not shown) formed on each of the chips 3 therethrough and to partially seal the plurality of chips 3; metallic wires 5 formed along the surface of the patterned encapsulant 4 for electrical connection; and an insulation layer 6 formed along the metallic wires 5 for electrical insulation. Therein, reference numeral 7 denotes a patterned conductor.

The steps for fabricating the thusly constituted repairable multichip module according to the conventional art will now be described.

The adhesive 2 having a predetermined thickness is formed on the substrate 1. The plurality of chips 3 are respectively attached on predetermined locations of the adhesive 2. The encapsulant 4 is molded surrounding the plurality of chips 3. The encapsulant 4 is partially etched to expose the plurality of chip pads (not shown) therethrough. A metallization process is carried out to form the metallic wires 5 along the surface of the encapsulant 4, and an insulation process is carried out to form the insulation layer 6 on the surface of the encapsulant 4. The patterned conductor 7 is formed along the insulation layer 6 using an etching method, thereby completing its fabrication method.

As described, the repairable multichip module is fabricated using a plurality of complicated steps such as a metallization step, an insulation step, an etching step and the like, making it difficult to improve productivity and accomplish cost reduction.

Further, the removal or replacement of defective chips with normal chips has required complicated steps. For instance, defective chips detected after assembly should be removed by employing a chemical or physical method such as solvent-applied metallic wire removal and selective ultraviolet scanning.

SUMMARY OF THE INVENTION

It is an object of the present invention to provide a semiconductor multichip module capable of overcoming the conventional disadvantages.

It is also an object of the present invention to provide a semiconductor multichip module capable of improving manufacturing productivity by decreasing production time.

It is another object of the present invention to provide a semiconductor multichip module for facilitating defective chip replacement.

To achieve the above and other objects, there is provided a semiconductor multichip module according to the present invention which includes a plurality of semiconductor chips, a static plate having a plurality of insertion holes for receiving the plurality of chips, a shield cap attached to the lower surface of the static plate so as to prevent the chips from deviating downwardly through the insertion holes, an external terminal unit formed over the chips so as to externally deliver electrical signals of the chips, and a plurality of clip-type clamp springs for clamping the shield cap and the external terminal unit so as to prevent the chips from externally deviating.

Further scope of applicability of the present invention will become apparent from the detailed description given hereinafter. However, it should be understood that the detailed description and specific examples, while indicating preferred embodiments of the invention, are given by way of example only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
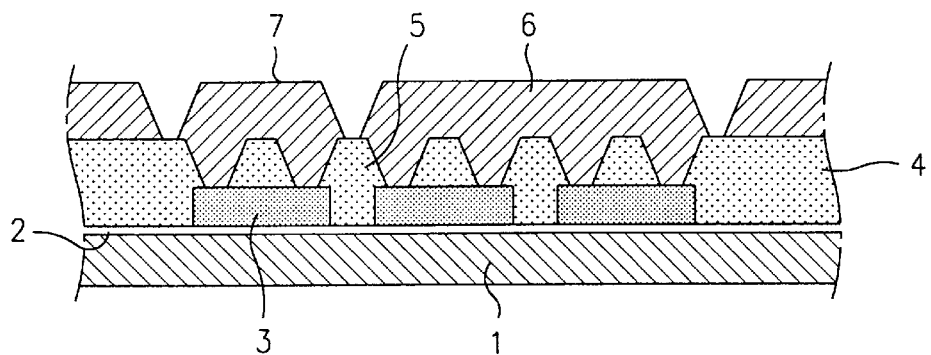
FIG. 1 is a cross-sectional view of a repairable semiconductor multichip module according to a conventional art.
Figure 2:
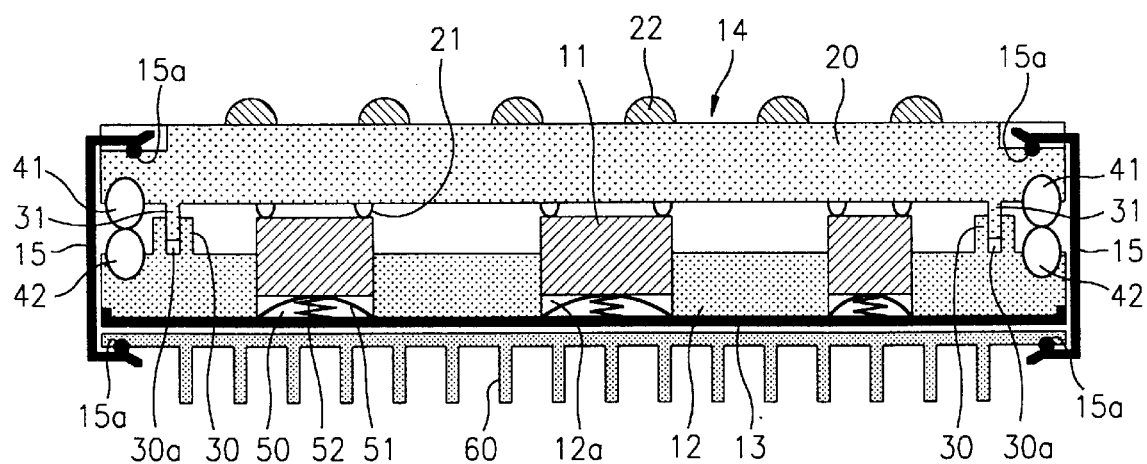
FIG. 2 is a cross-sectional view of a semiconductor multichip module according to the present invention.
Figure 3:
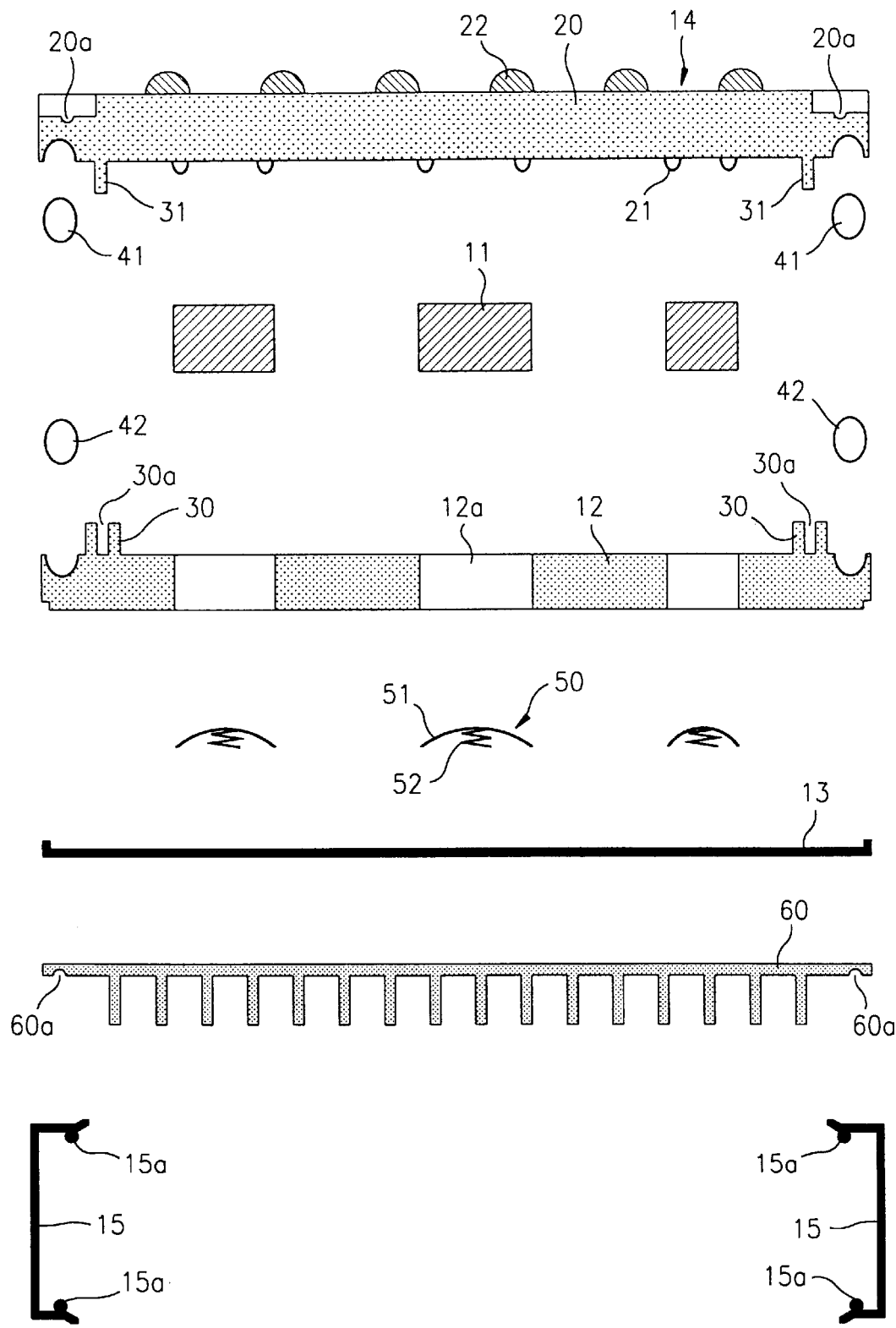
FIG. 3 is a cross-sectional view of a disassembled semiconductor multichip module according to the present invention.

With reference to the accompanying drawings, a semiconductor multichip module according to the present invention will now be described. FIG. 2 illustrates a cross-sectional view of the semiconductor multichip module according to the present invention, and FIG. 3 shows a disassembled cross-sectional view of the semiconductor multichip module according to the present invention.

As shown therein, the semiconductor multichip module according to the present invention includes: a plurality of semiconductor chips 11; a static plate 12 having a plurality of insertion holes 12a for receiving the plurality of chips 11 therethrough; a shield cap 13 attached to the lower surface of the static plate 12 so as to prevent the chips 11 from being downwardly deviated through the insertion holes 12a; an external terminal unit 14 formed over the chips 11 so as to externally deliver electrical signals of the chips 11; and a plurality of clip-type clamp springs 15 for clamping the shield cap 13 and the external terminal unit 14 so as to prevent the chips 11 from being displaced.

Figure 4A:
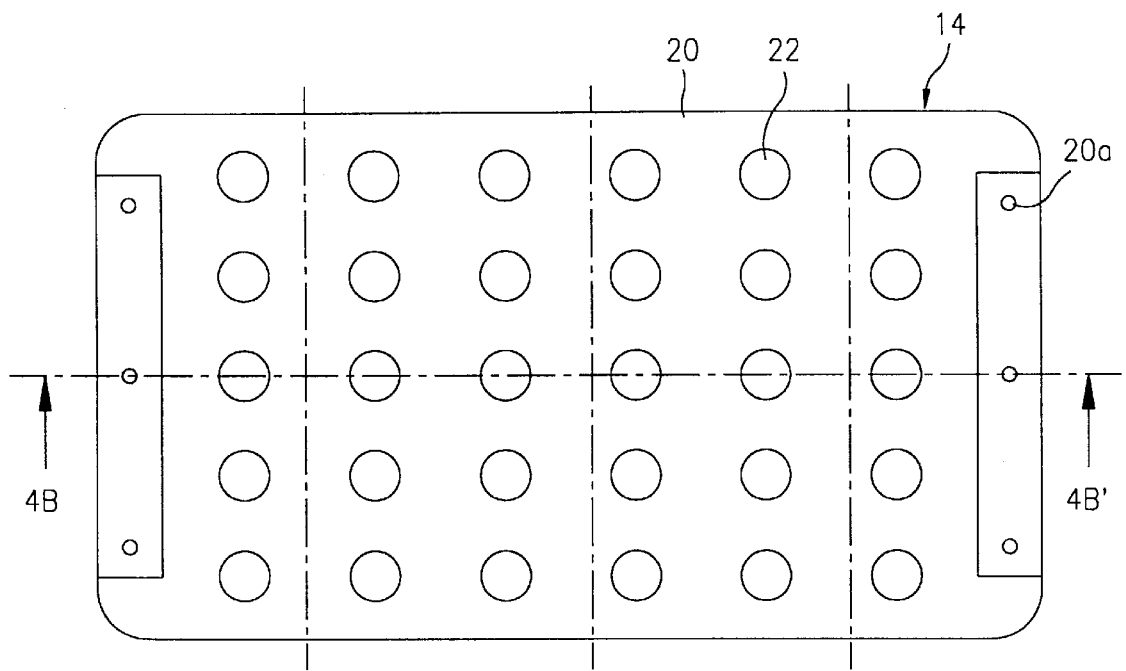
FIG. 4A is a plan view illustrating an external terminal unit of a semiconductor multichip module according to the present invention.
Figure 4B:
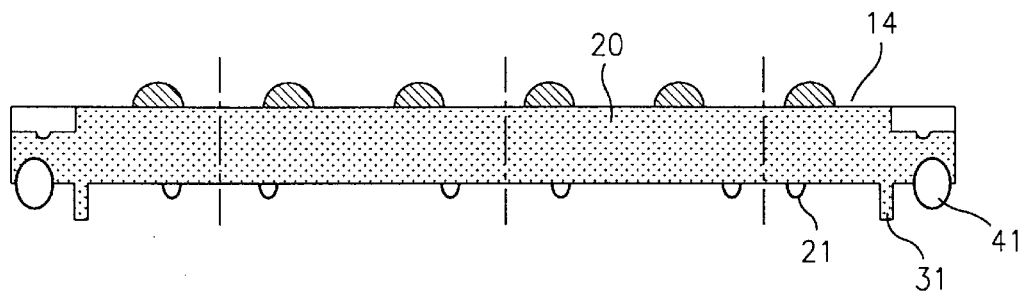
FIG. 4B is a cross-sectional view taken along line 4B–4B' of FIG. 4A.
Figure 4C:
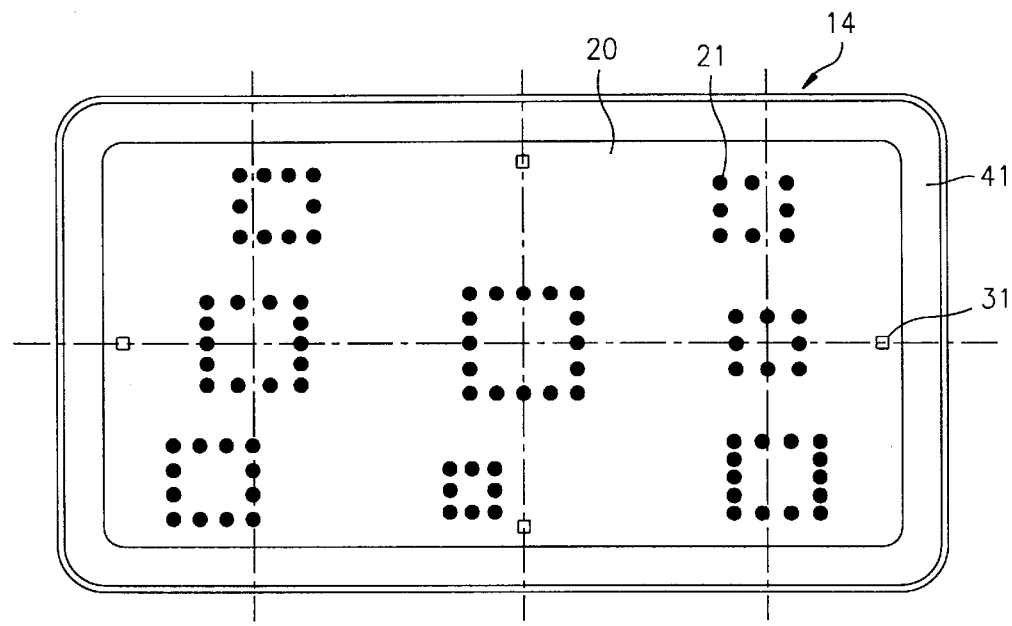
FIG. 4C is a bottom view of an external terminal unit of a semiconductor multichip module according to the present invention.

Referring to FIGS. 4A through 4C, the external terminal unit 14 includes: a multi-layered substrate 20; a plurality of bumps 21 formed on a lower surface of the substrate 20 so as to be in contact with a plurality of pads (not shown) formed on each of the chips 11; and a plurality of solder balls 22 formed on an upper surface of the substrate 20 for externally transmitting electrical signals. A plurality of guide protrusions 31 extend from the lower surface of the substrate 20.

Figure 5A:
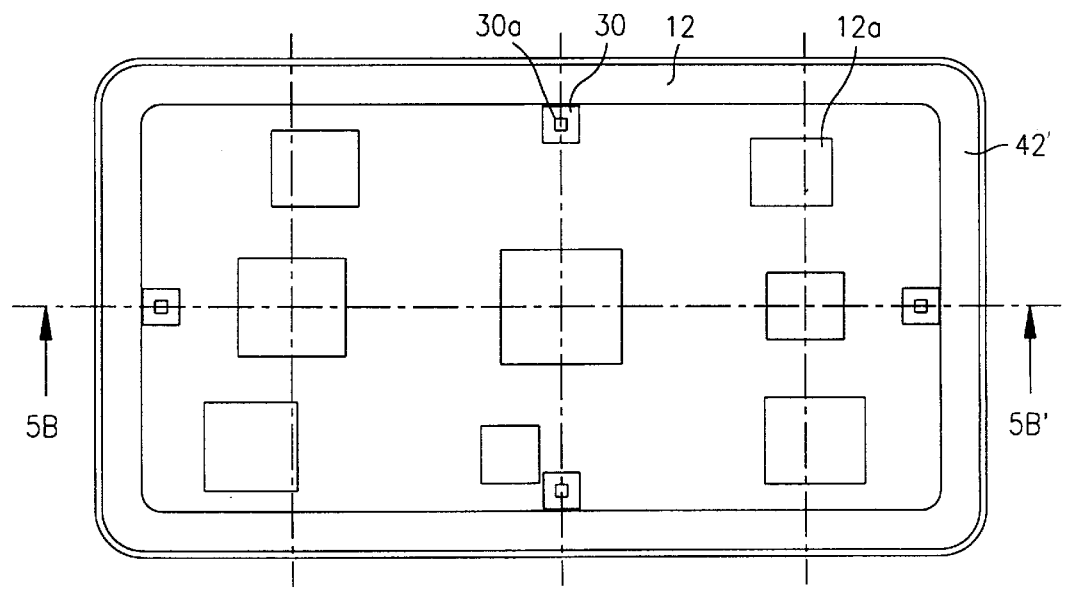
FIG. 5A is a plan view illustrating a static plate of a semiconductor multichip module according to the present invention.
Figure 5B:
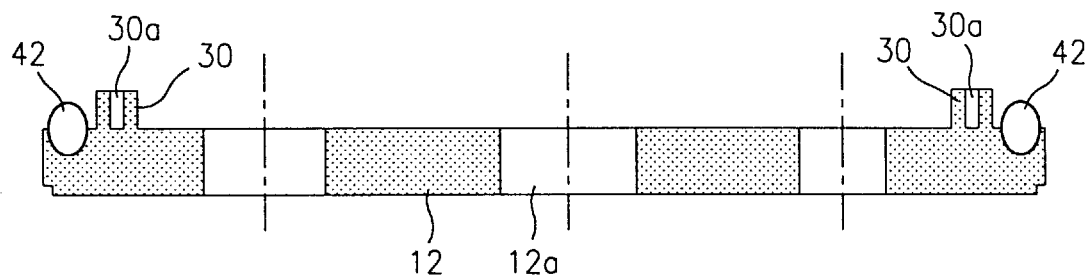
FIG. 5B is a cross-sectional view taken along line 5B–5B' of FIG. 5A.
Figure 5C:
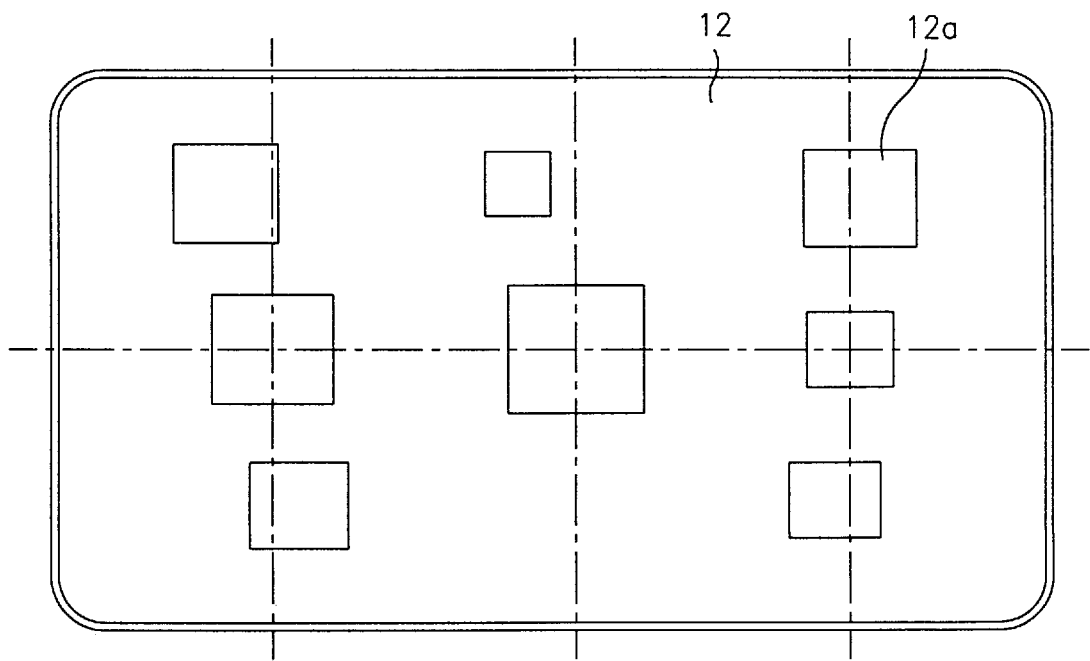
FIG. 5C is a bottom view illustrating a static plate of a semiconductor multichip module according to the present invention.

As shown in FIGS. 5A through 5C, the static plate 12 includes a plurality of pronged portions 30 each having a guide opening 30a between its prongs, corresponding to the plurality of guide protrusions 31 extending from the lower surface of the substrate 20 of the external terminal unit 14, whereby the guide protrusions 31 are respectively guided into the corresponding ones of the plurality of guide openings 30a.

An upper sealing ring 41 is mounted in and along a circumferential edge of the lower surface of the substrate 20, and a lower sealing ring 42 is mounted in and along a circumferential edge of the upper surface of the static plate 12 so as to correspond to the upper sealing ring 41, thereby protecting the chips 11 against the external environment.

Figure 6A:
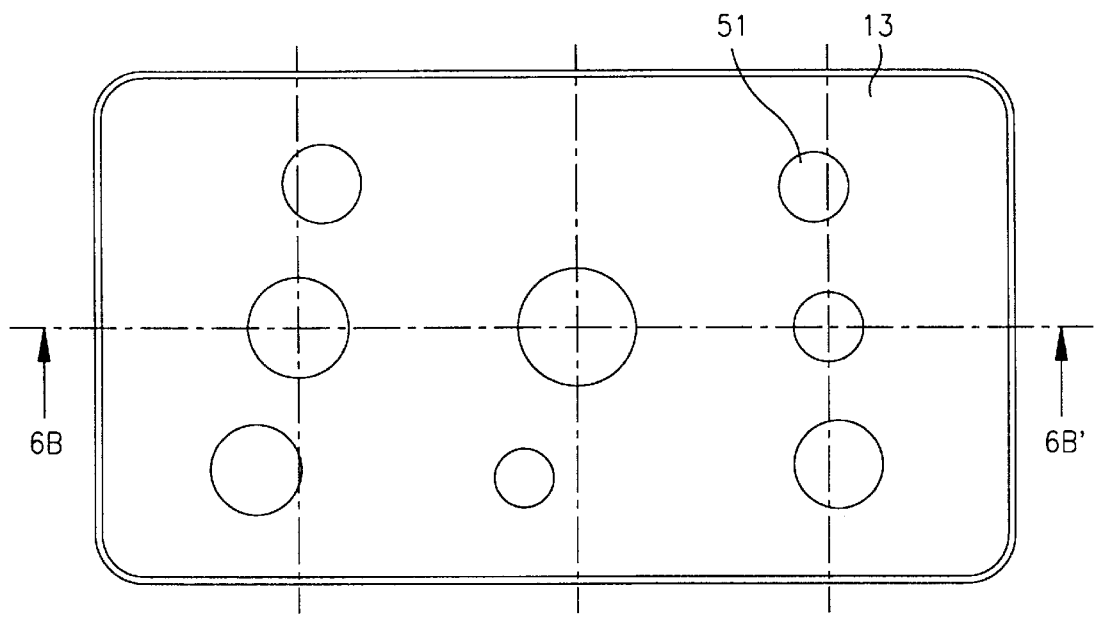
FIG. 6A is a plan view of a shield cap having elastic members of a semiconductor multichip module according to the present invention.
Figure 6B:
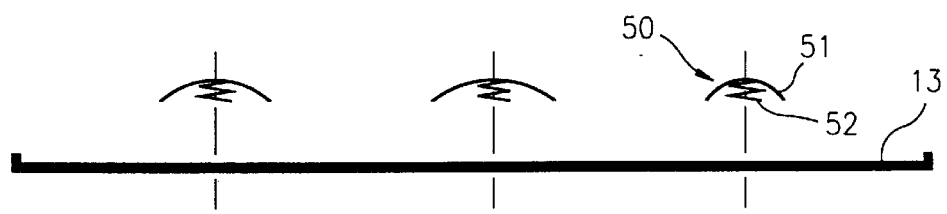
FIG. 6B is a cross-sectional view taken along line 6B–6B' of FIG. 6A.

With reference to FIGS. 6A and 6B, an elastic member 50 including a round cap 51 and a support spring 52, which elastically supports the round cap 51, is installed in each of the insertion holes 12a and below corresponding ones of the chips 11, so as to elastically support the corresponding chips 11.

A heat sink 60 is attached to a lower surface of the shield cap 13 so as to externally discharge heat generated from the respective chips 11 during chip operation.

A hook boss 15a is formed on an inner portion of each end portion of the clamp spring 15, and hooker openings 20a, 60a (see FIG. 7) are respectively formed in corresponding edge portions of the upper surface of the substrate 20 and the lower surface of the heat sink 60. When the clamp spring 15 is clamped, the hook bosses 15a are hooked in each of the corresponding hooker openings 20a, 60a, for thereby retaining the clamp spring 15.

The method for assembling the thusly constituted semiconductor multichip module according to the present invention will now be described.

First, the static plate 12 is positioned on the upper surface of the shield cap 13, and an elastic member 50 is inserted into each of the plurality of insertion holes 12a formed through the static plate 12.

A chip 11 is inserted into each of the insertion holes 12a of the static plate 12 so that the chip 11 is placed on an upper surface of each of the elastic members 50. The external terminal unit 14 is mounted on the upper surface of the static plate 12, so that the plurality of bumps 21 formed on the lower surface of the substrate 20 contact pads (not shown) formed on each of the chips 11. At this time, the guide protrusions 31, extending from the lower surface of the substrate 20 of the external terminal unit 14, are guided into corresponding hooker openings 30a of the pronged portions 30 formed on the upper surface of the static plate 12. Nitrogen $N_2$ gas at less than atmospheric pressure is then filled into the space C formed between the static plate 12 and the substrate 20. The space C is maintained under a partial vacuum state by being sealed by the upper and lower sealing rings 41, 42, so that the respective chips 11 are protected from externally influential factors such as moisture.

After mounting the heat sink 60 onto the lower surface of the shield cap 13, the clamp springs 15 are clamped onto the substrate 20 and the heat sink 60, wherein the hook bosses 15a of the clamp spring 15 are hooked in corresponding hooker openings 20a, 60a respectively formed in the upper surface of the substrate 20 and the lower surface of the heat sink 60, for thereby completing the semiconductor multichip module according to the present invention.

Figure 7:
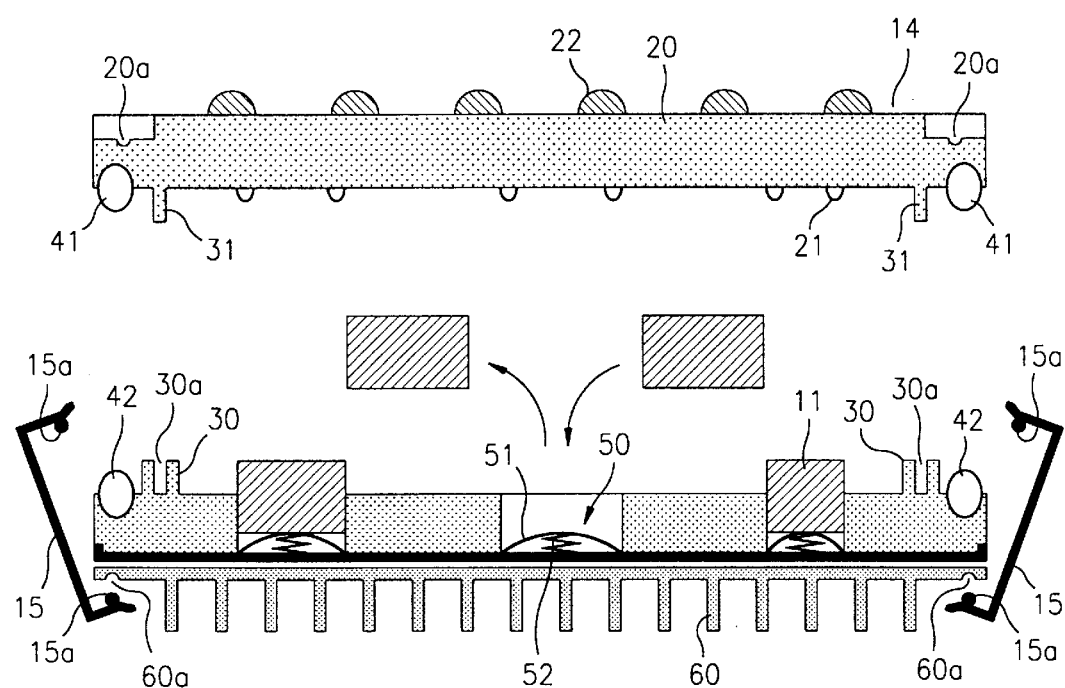
FIG. 7 is a cross-sectional view of a semiconductor multichip module according to the present invention for demonstrating the replacement of defective semiconductor chips therein.

FIG. 7 illustrates a defective chip replacement method involving the semiconductor multichip module according to the present invention. As shown therein, when defective chips are detected, the clamp spring 15 is disassembled and the substrate 20 is detached from the module. Accordingly, the defective chips are replaced with normal chips, and the multichip module is reassembled as described above under a nitrogen gas atmosphere.

As described above, the semiconductor multichip module according to the present invention includes a plurality of semiconductor chips, a static plate having a plurality of insertion holes for receiving the plurality of chips, a shield cap attached to the lower surface of the static plate for preventing the chips from deviating downward through the insertion holes, an external terminal unit formed over the chips communicating electrical signals of the chips, and a plurality of clip-type clamp springs clamping the shield cap and the external terminal unit for preventing the chips from displacing.

Conclusively, the semiconductor multichip module according to the present invention improves productivity by decreasing production hours.

Further, the semiconductor multichip module according to the present invention enables defective chips to be easily replaced with normal chips by disassembling and reassembling the clamp springs.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefore, it is intended that the present invention not be limited to the particular embodiment disclosed as the best mode contemplated for carrying out the present invention, but that the present invention includes all embodiments falling within the scope of the appended claims.

The foregoing description and the drawings are regarded as including a variety of individually inventive concepts, some of which may lie partially or wholly outside the scope of some or all of the following claims. The fact that the applicant has chosen at the time of filing of the present application to restrict the claimed scope of protection in accordance with the following claims is not to be taken as a disclaimer of alternative inventive concepts that are included in the contents of the application and could be defined by claims differing in scope from the following claims, which different claims may be adopted subsequently during prosecution, for example, for the purposes of a continuation or divisional application.

What is claimed is:

1. A semiconductor multichip module, comprising:
    a static plate having a plurality of insertion holes therethrough, each insertion hole for receiving a corresponding one of plural semiconductor chips;
    a shield cap positioned adjacent a lower surface of the static plate for preventing the chips from deviating downward through the insertion holes;
    an external terminal unit positioned over the semiconductor chips for externally transmitting electrical signals of the semiconductor chips; and
    a plurality of clamp springs for clamping the shield cap and the external terminal unit together to prevent the semiconductor chips from being displaced.

2. The multichip module of claim 1, wherein the external terminal unit comprises:
    a multi-layered substrate;
    a plurality of bumps formed on a lower surface of the substrate for contacting a corresponding plurality of pads formed on a surface of the semiconductor chips; and
    a plurality of solder balls formed on an upper surface of the substrate for externally transmitting electrical signals.

3. The multi-chip module of claim 2, wherein
    the static plate includes a plurality of pronged portions, a guide opening being defined between each of the prongs thereof, and
    the external terminal unit includes a plurality of guide protrusions extending from a lower surface thereof, the guide protrusions of the external terminal unit being respectively guided into corresponding guide openings of the static plate.

4. The multichip module of claim 1, further comprising:
    an upper sealing ring that is mounted in and along a circumferential edge of a lower surface of a substrate of the external terminal unit, and
    a lower sealing ring, corresponding to the upper sealing ring, that is mounted in and along a circumferential edge of an upper surface of the static plate for sealing the chips against the external environment.

5. The multichip module of claim 1, further comprising:
    elastic means formed below each of the semiconductor chips for elastically supporting a corresponding one of the semiconductor chips.

6. The multichip module of claim 5, wherein the elastic means comprising:
    a round cap provided below each of the chips; and
    a support spring for elastically supporting the round cap.

7. The multichip module of claim 1, further comprising:
    a heat sink attached to a lower surface of the shield cap for externally discharging heat generated from the semiconductor chips.

8. The multichip module of claim 7, wherein
    the clamp springs include a hook boss positioned on an inner portion of each end portion thereof,
    the external terminal unit includes a substrate, and a plurality of hooker openings positioned in corresponding edge portions of an upper surface of the substrate, and
    the heat sink includes a plurality of hooker openings positioned in the lower surface of the heat sink,
    wherein the hook bosses are each hooked in corresponding hooker openings of the external terminal unit and the heat sink for retaining the clamp spring therein.

9. A semiconductor chip module, comprising:
    upper and lower members;
    a plate having plural insertion holes for receiving a corresponding one of plural semiconductor chips to be accommodated by the multichip module, the plate being positioned between the upper and lower members; and
    at least one clamp for clamping the upper and lower members together.

10. The semiconductor chip module recited by claim 9, wherein the clamp is positioned at a corresponding end of the upper and lower members.

11. The semiconductor chip module recited by claim 9, further comprising:
    more than one semiconductor chip positioned between the upper and lower members.

12. The semiconductor chip module recited by claim 11, wherein the upper member communicates electrical signals between the semiconductor chip and external devices.

13. The semiconductor chip module recited by claim 11, wherein the lower member comprises:
    a static plate having insertion holes for receiving the semiconductor chips; and
    a shield cap, positioned beneath the static plate, for preventing the chips from deviating downward through the insertion holes of the static plate.

14. The multichip module of claim 11, further comprising:
    elastic means formed below each of the semiconductor chips for elastically supporting a corresponding one of the semiconductor chips.

15. The semiconductor chip module recited by claim 14, further comprising:
    a heat sink attached to a lower surface of the shield cap for externally discharging heat generated from the semiconductor chips.

16. The semiconductor chip module recited by claim 1, further comprising:
    plural semiconductor chips respectively positioned within the insertion holes of the static plate.

17. A semiconductor chip module, comprising:
    upper and lower members; and
    at least one clamp for clamping the upper and lower members together, such that more than one semiconductor chip may be positioned between the upper and lower members,
    wherein the upper member communicates electrical signals between the semiconductor chips and external devices, and
    wherein the upper member comprises:
    a multi-layered substrate;
    a plurality of bumps positioned on a lower surface of the substrate for contacting a corresponding plurality of pads located on a surface of the semiconductor chips; and a plurality of solder balls positioned on an upper surface of the substrate for externally transmitting electrical signals.

18. A semiconductor chip module, comprising:

upper and lower members; and at least one clamp for clamping the upper and lower members together, such that more than one semiconductor chip may be positioned between the upper and lower members, wherein the lower member comprises:
    a static plate having insertion holes for receiving the semiconductor chips: and
    a shield cap, positioned beneath the static plate, for preventing the chips from deviating downward through the insertion holes of the static plate, wherein the static plate includes a plurality of pronged portions, a guide opening being defined between each of the prongs thereof, and wherein the upper member includes a plurality of guide protrusions extending from a lower surface thereof, the guide protrusions of the upper member being respectively guided into corresponding guide openings of the static plate.

19. A semiconductor chip module comprising:

upper and lower members; and at least one clamp for clamping the upper and lower members together;

an upper sealing ring that is mounted in and along a circumferential edge of a lower surface of a substrate of the upper member, and a lower sealing ring, corresponding to the upper sealing ring, that is mounted in and along a circumferential edge of an upper surface of the static plate for sealing the chips against the external environment, wherein more than one semiconductor chip is positioned between the upper and lower members.

20. A semiconductor chip module, comprising:

upper and lower members;

at least one clamp for clamping the upper and lower members together; and elastic means formed below each of the semiconductor chips for elastically supporting a corresponding one of the semiconductor chips, wherein the elastic means comprises:
    a round cap provided below each of the chips; and
    a support spring for elastically supporting the round cap, and wherein more than one semiconductor chip is positioned between the upper and lower members.

21. A semiconductor chip module, comprising:

upper and lower members, the lower member comprising:
    a static plate having insertion holes for receiving semiconductor chips, and
    a shield cap, positioned beneath the static plate, for preventing the chips from deviating downward through the insertion holes of the static plate;

at least one clamp for clamping the upper and lower members together; and a heat sink attached to a lower surface of the shield cap for externally discharging heat generated from the semiconductor chips, wherein more than one semiconductor chip is positioned between the upper and lower members, wherein the at least one clamp includes a hook boss positioned on an inner portion of each end portion thereof, wherein the upper member includes a substrate, and a plurality of hooker openings positioned in corresponding edge portions of an upper surface of the substrate, and wherein the heat sink includes a plurality of hooker openings positioned in the lower surface of the heat sink, and wherein the hook bosses are each hooked in corresponding hooker openings of the external terminal unit and the heat sink for retaining the clamp spring therein.

* * * * *